May 21, 1963 W. MINNER 3,090,927

AUTOMATIC GAIN CONTROL CIRCUIT

Filed Aug. 1, 1960 3 Sheets-Sheet 1

INVENTOR
Willy Minner

BY George H Spencer

ATTORNEY

AUTOMATIC GAIN CONTROL CIRCUIT

Filed Aug. 1, 1960

3 Sheets-Sheet 2

INVENTOR
Willy Minner

BY George M. Spencer
ATTORNEY

May 21, 1963 W. MINNER 3,090,927

AUTOMATIC GAIN CONTROL CIRCUIT

Filed Aug. 1, 1960 3 Sheets-Sheet 3

INVENTOR
Willy Minner

BY George H. Spencer
ATTORNEY

United States Patent Office 3,090,927

Patented May 21, 1963

3,090,927

AUTOMATIC GAIN CONTROL CIRCUIT

Willy Minner, Ulm (Danube), Germany, assignor to Telefunken G.m.b.H., Berlin, Germany Filed Aug. 1, 1960, Ser. No. 46,571
Claims priority, application Germany Aug. 14, 1959
9 Claims. (Cl. 330—29)

The present invention relates to a tuned high frequency transistor amplifier with automatic gain control.

In high frequency receivers, in order to compensate for fading and for different field strengths at the receiver, means must be provided for maintaining the output level of such receivers substantially independent of the input level. In receivers employing tubes, the level is generally maintained by changing the working point on the characteristic curves of the gain-controlled tubes. This method is basically feasible in transistorized receivers, but when the working point on the characteristic curve of a transistor is changed, this changes not only the slope of the transistor characteristic, but also the complex input and output admittances. This produces, in addition to the desired gain control, variations in the tuning resulting in undesirable distortion of the selectivity of the receiver.

In order to maintain this distortion within reasonable limits, it has been known to couple the transistor only loosely to the tuned-circuit means. This, however, leads to a substantial loss in over-all amplification. It is also known to reduce the distortion of the selectivity curve by connecting diodes in parallel with the input and output of the transistor, the A.C. resistanecs of which diodes are inversely varied when the working point of the transistor is changed. It has been found, however, that with such an arrangement compensation can be obtained only within a limited range, which range decreases with increasing operating frequency. For example, in an I.F. amplifier stage for television receivers, operating at 36 megacycles, and built with the highest quality transistors which are at present commercially available, the gain control range is only about 10 to 15 db, even assuming minimal requirements as to distortion of the pass-band characteristic.

It is also known, as disclosed in British Patent No. 413,383, to connect a dry rectifier in a series leg of the transmission system ahead of the actual amplifier, which dry rectifier is controlled by a D.C. control voltage. For example, the dry rectifier can be connected between an antenna and an unregulated tube-type receiver, there being a steady current flowing through the rectifier. However, at high frequencies, this arrangement, too, has a narrow range of gain control due to the above-mentioned mode of operation as well as to the internal capacitance of the rectifier.

It is, therefore, an object of the present invention to provide a tuned high frequency transistor amplifier with automatic gain control which overcomes the above disadvantages. According to the instant invention, the known circuits are improved to such an extent that if the signal frequency is, for example, 36 megacycles, a control range of from 60 to 80 db is obtained, without there being any substantial distortion of the tubing characteristic or any substantial loss of maximum amplification. The circuit according to the present invention uses, as does the prior art, a controllable four-terminal transmission network, the series branch of which contains a rectifier controlled by the D.C. control voltage, which network serves as a gain control means. According to the present invention the following additional characteristic features are used;

(*a*) A control transistor is connected between the source of a gain control voltage and a diode rectifier, the latter being preferably a germanium point diode. In the absence of signal input voltage, the transistor biases the diode with a D.C. voltage of such amplitude that when there is no input signal voltage or a small input signal voltage, the diode will pass direct currents, whereas upon substantial increase in the input signal voltage, the control transistor, due to the change in value of the control voltage, reverses the polarity of the voltage appearing across the diode and thereby changes the operating point thereof from conductive toward non-conductive with respect to direct currents.

(*b*) The residual resistance and residual capacitance of the diode which is still present at the end of this D.C. blocking range is neutralized by a bridge circuit or by an inductance which is connected in parallel with the diode.

Additional objects and advantages of the present invention will become apparent upon consideration of the following description when taken in conjunction with the accompanying drawings in which.

Figure 3:
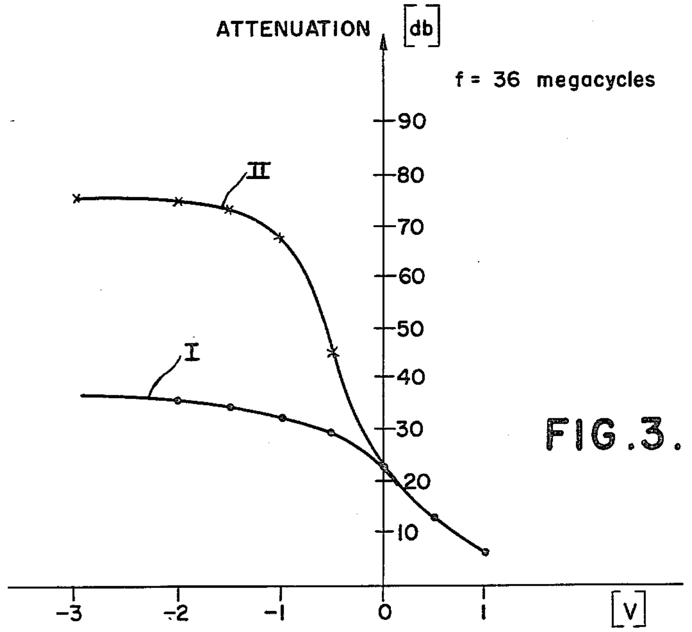

FIGURE 3 shows attenuation curves of the transmission characteristic as a function of the D.C. diode-bias voltage when the operating frequency is 36 megacycles. The curve I applies when the internal capacitance of the diode is not neutralized; curve II applies when the internal capacitance is neutralized and takes into consideration a certain amount of neutralization error which, in practice, arises.

Figure 4:
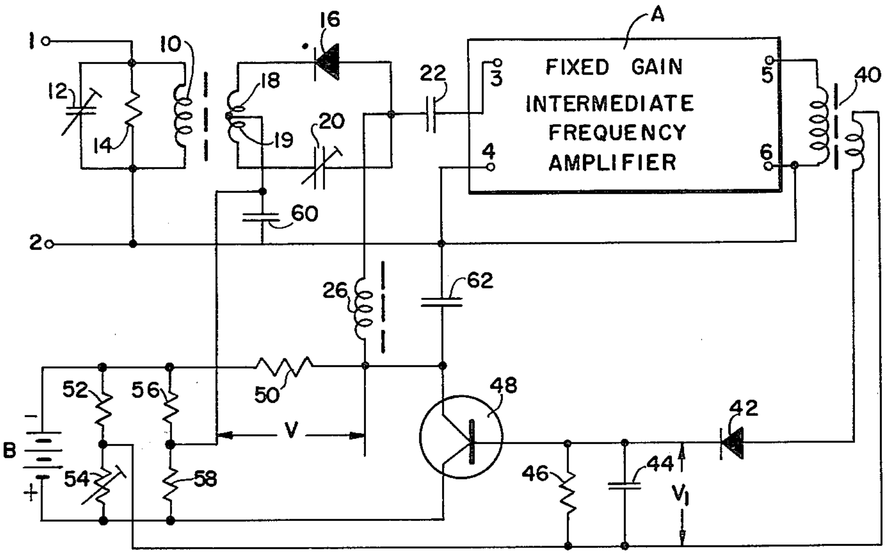

FIGURE 4 shows an automatic gain control circuit according to the present invention.

Figure 5:
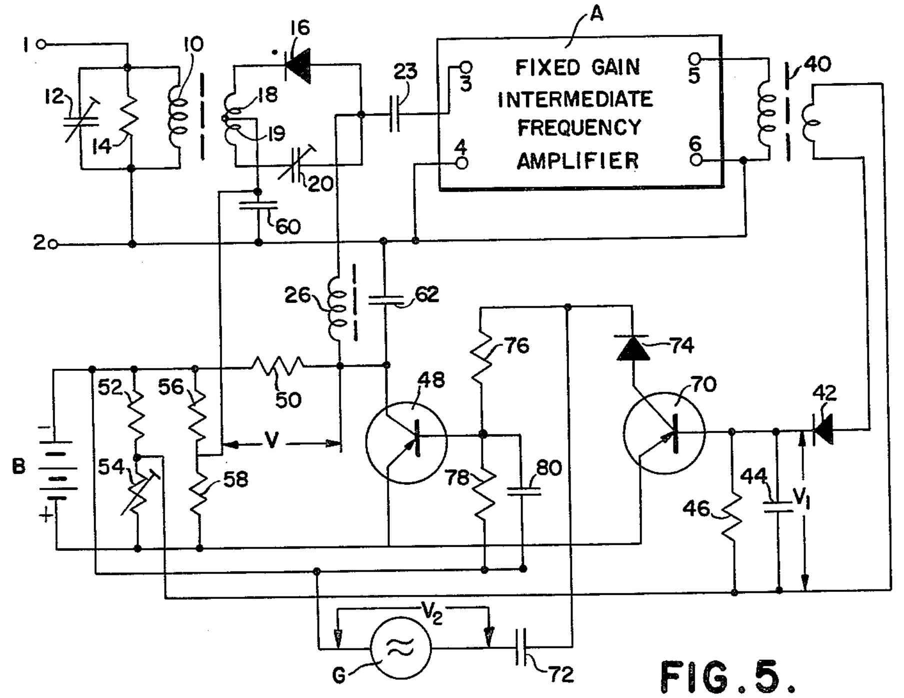

FIGURE 5 shows a circuit which includes a second transistor and a diode for increasing the control range.

Figure 6:
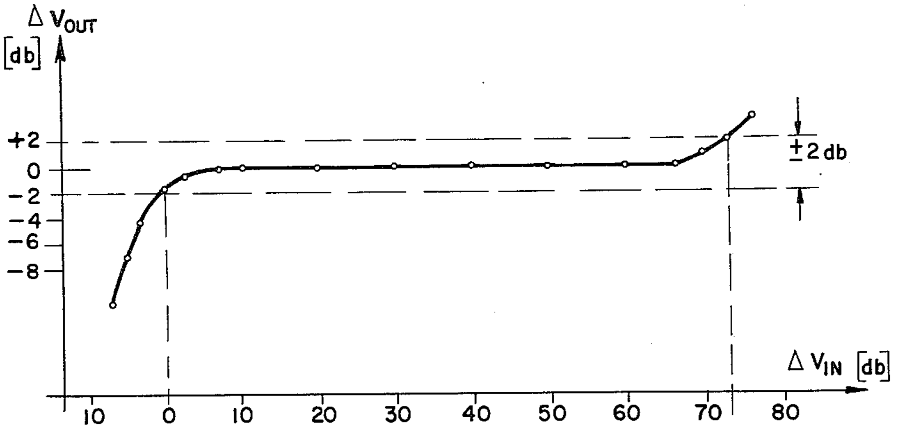

FIGURE 6 shows a curve of the measured control action in a transistorized television receiver IF amplifier regulated by a circuit according to FIGURE 5. The operating frequency is 36 megacycles.

Figure 1:
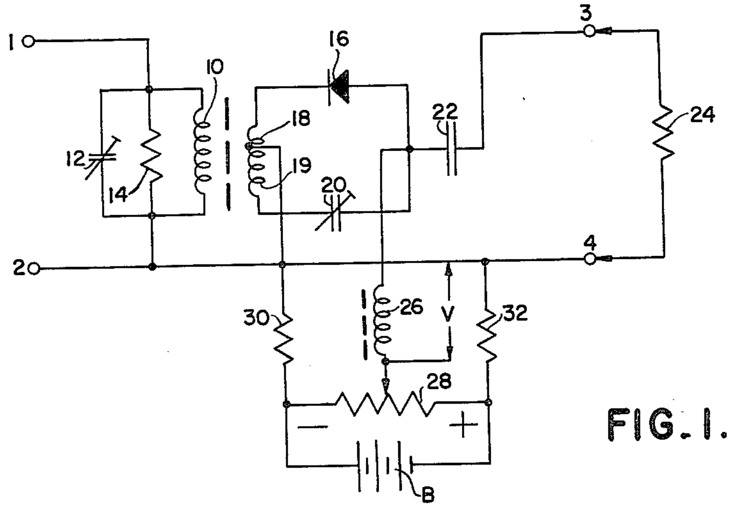
FIGURE 1 shows a circuit for controlling the transmission characteristic of a four-terminal network in which the regulation can be carried out manually by adjusting the bias across a germanium diode in a series branch of the network, the residual capacitance of the diode being neutralized by a bridge network.

Referring now to the drawings, in which similar parts bear like reference numerals, FIGURE 1 shows a four-terminal transmission network to which the input signal voltage is applied at terminals 1, 2. The input coil 10 is tuned to resonance by means of a trimmer capacitor 12. The resistance 14 dampens the input circuit so that its band width is wider than the desired total band width of the subsequent amplifier stages to be coupled to the output terminals 3, 4. The purpose of this is to prevent the over-all pass characteristic curve of the receiver, during regulation of the transmission factor, from being influenced by band width changes of the stage which occur during the regulation of the network. The diode 16 and the winding 18 form one leg of the bridge, while the neutralizing trimmer capacitor 20 and the winding 19 form the other leg. The residual diode capacitance is neutralized by the trimmer capacitor 20, the balance being adjusted, when the diode 16 is fully cut off by the reverse bias voltage, by balancing the capacitor 20 to attain minimum output voltage at terminals 3, 4. When the bridge is detuned, i.e., when the diode 16 is in conductive state, the input signal reaches the output terminals 3, 4 by way of the differential resistance of the diode 16 and the D.C. blocking capacitor 22. A load resistance 24 is connected across terminals 3 and 4 to represent the input resistance of the subsequent transistorized amplifier (not shown).

The bridge is detuned by applying a D.C. voltage V across the diode 16, this voltage being applied by way of a choke 26, which prevents the flow of the signal voltage to the source of D.C. voltage. The battery B can, by way of the potentiometer 28 and the resistances 30 and 32, supply such a D.C. voltage to the diode 16 that the conductivity of this diode can be continuously adjusted between fully conductive and fully blocked limits in order to regulate the transmission factor of the network.

Figure 2:
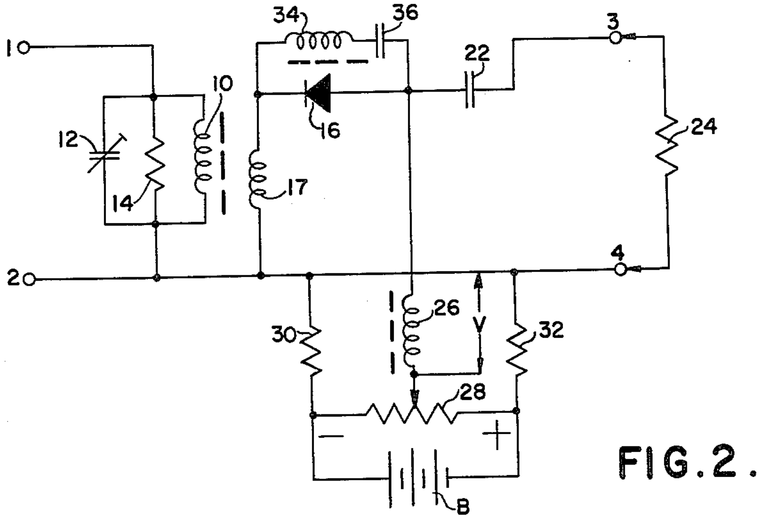
FIGURE 2 is a circuit similar to FIGURE 1 but wherein the residual capacitance of the diode is compensated for by an appropriate inductance connected in parallel with the diode.

Instead of the bridge circuit shown in FIGURE 1, a single transformer secondary winding 17 can be used and the internal capacitance of the diode 16 can be neutralized by connecting an appropriate inductance 34 in parallel with the diode 16, as shown in FIGURE 2. The capacitor 36 serves to block out D.C. and for all practical purposes offers no impedance at the signal frequency.

FIGURE 3 shows the transmission attenuation of the four-terminal network of FIGURE 1 as a function of the D.C. voltage V across the diode 16 when the signal frequency is 36 megacycles. Curve I shows the attenuation without there being any compensation for the internal capacitance of the diode, i.e., capacitor 20=0. Curve II shows the attenuation when the internal capacitance of the diode 16 is neutralized by the trimmer capacitor 20 charged to −3 v. Naturally, a certain neutralization error can not be avoided, and this error is considered in the plot of curve II as shown in FIGURE 3. With a signal frequency of 36 megacycles, a control factor of about 30 db can be reached with an unneutralized diode 16 whereas about 70 db can be reached with neutralization. FIGURE 3 also shows that the non-linear distortions of the high frequency signal caused by the control arrangement can be avoided because the slope increase of curve II is relatively flat between a D.C. voltage V of about −1 v. to −3 v., and the circuit components can be so selected that only large A.C. signal voltages will appear in this range.

FIGURE 4 shows an automatic gain control circuit according to the present invention. The four- terminal transmission network, which is regulatable by a D.C. voltage, corresponds to that of FIGURE 1, with the additional feature that the transmission factor is regulated automatically as a function of the output voltage of a transistorized amplifier A which is connected to the output of the four-terminal network. To accomplish this, a portion of the output is taken from amplifier output terminals 5 and 6 by a transformer 40, rectified by the diode circuit 42, 44 and 46, and applied as a control voltage VI to the base of the control transistor 48, the latter having a collector resistance 50. The quiescent operating point of the transistor 48 is so adjusted by the resistors 52 and 54 that when there is a small high frequency input signal, a large collector current will flow through the control transistor 48. This means that for all practical purposes, the positive potential of the battery B is applied to the anode of the diode 16 by way of the choke 26. The cathode of the diode 16 is connected, by way of a voltage divider composed of resistances 56 and 58, to a battery potential which is equal to approximately half the battery voltage. The diode 16 is therefore in conductive state and represents a very small A.C. resistance so that by appropriate selection of the input resistance of the amplifier A, an amplification loss of about 6 db is obtained. If now the input signal at the terminals 1, 2 of the four-terminal network increases, the output signal at terminals 5, 6 of the amplifier A will likewise increase and the control voltage VI becomes larger. By appropriate selection of the polarity of this control voltage, the current flow through the control transistor 48 can be made to become smaller and at very large input A.C. voltages, the current becomes zero. The anode of diode 16 will then, by way of resistance 50, be at the negative battery voltage and the diode 16 will be in blocked condition. The diode will therefore become a high A.C. resistance and the damping of the four-terminal network will be very high. The capacitors 60 and 62 serve to by-pass the signal voltage in the control circuit.

FIGURE 5 shows an arrangement according to the present invention in which the control slope is increased substantially by insertion of an additional transistor 70, with the necessary control output for the control transistor 48 being supplied by an oscillator G, for example, the scanning line output of a television receiver. The transistor 70 behaves as a base-controlled rectifier to which the oscillator voltage V2 is applied by way of the charging capacitor 72. If a diode 74 is connected between the collector of transistor 70 and the junction of capacitor 72 and resistance 76, with the polarity of the diode 74 being as shown in FIGURE 5, the positive half wave of the oscillator voltage is prevented from flowing off by way of the collector-base path of this p-n-p transistor 70, and a positive D.C. voltage is produced across capacitor 72 the amplitude of which is dependent on the applied oscillator voltage V2 and on the control voltage V1 at the base of transistor 70. This voltage across the capacitor 72 is applied to the base of transistor 48 by way of resistance 76, this base being connected to the negative potential of the battery B by way of resistance 78. The capacitor 80 by-passes the oscillator voltage V2 at the base of the transistor 48, in order to prevent the oscillator frequency from entering into the amplifier.

FIGURE 6 shows the excellent control curve of the above arrangement, this figure representing the measured values of the output voltage at the terminals 5, 6 of the amplifier versus the input voltage at the terminals 1, 2. With the measuring frequency being 36 megacycles and the variations of the input voltage $V_{in}$ being approximately 73 db, the output voltage $V_{out}$ fluctuates only about ±2 db. At the same time, the selectivity curve of the entire amplifier as measured by applying a swept-frequency input signal was observed on an oscillograph. No distortion of the pass band curve shape was noted throughout the entire automatic gain control range of 73 db.

It will be understood that the above description of the present invention is susceptible to various modifications, changes and adaptations, and the same are intended to be comprehended within the meaning and range of equivalents of the appended claims.

I claim:

1. In a tuned high frequency transistorized amplifier having a rectified output comprising a gain control potential and having a four-terminal transmission network connected to the input to the amplifier, said network having in a series branch a diode rectifier controlled by a D.C. control voltage delivered by a control transistor connected to receive said gain control potential and to deliver said control voltage to said diode rectifier forward-biasing the latter in the absence of a signal input voltage to the network and in the presence of a small input signal voltage, and for reverse-biasing said diode rectifier in the presence of substantial increase in the input signal voltage, the improvement comprising means connected in parallel with said diode rectifier for neutralizing the residual series resistance and capacitance thereof when the diode is fully reverse-biased.

2. The improvement defined in claim 1 wherein said series branch and said means comprise a bridge circuit connected to the input of the amplifier and controlling the passage of signal input voltage thereto, said means comprising another series branch in parallel with and neutralizing said diode rectifier.

3. The improvement defined in claim 1 wherein said means comprise an inductance connected in parallel with said diode rectifier and having a reactance equal and opposite to the reactance of the internal capacity of the diode rectifier.

4. An automatic gain control system for controlling the over-all gain of a radio frequency signal through a fixed-gain amplifier having input and output terminals, comprising, in combination: a four-terminal network having a first pair of terminals connected to receive said signal and a second pair of terminals connected with the input terminals of said amplifier, said network including diode means comprising a series branch of the network and connected between one terminal in each of said pairs of terminals, the conductivity of the diode means controlling the transmission factor of the signal through the network; a source of direct current bias connected to the diode means to normally bias its conductivity in one direction; electronic control means connected with said source and to said network branch for reversing the bias potential applied across said diode means; rectifier means connected to the output of the amplifier and connected with said control means for controlling said reversal of bias potential in response to the amplitude of the signal at the amplifier output; and neutralizing impedance means connected in a second series branch of the network and neutralizing the internal capacitance of the diode means to reduce the transmission factor of the network substantially to zero when the diode means is blocked.

5. In a system as defined in claim 4, voltage divider resistance means connected across said bias source and coupled to said diode means for normally biasing it conductive; and said control means comprising a transistor having its collector-emitter circuit connected between one terminal of said bias source and the diode means and having its base electrode coupled to said rectifier means to control the conductivity of the transistor collector-emitter circuit, the polarity of the bias source terminal to which the transistor is connected being such as to render the diode means increasingly less conductive as the output signal increases and the collector-emitter circuit becomes more conductive.

6. An automatic gain control system for controlling the over-all gain of a radio frequency signal through a fixed-gain amplifier having input and output terminals, comprising, in combination: a four-terminal network having a first pair of terminals connected to receive said signal and a second pair of terminals connected with the input terminals of said amplifier, said network including a series branch connected between one terminal in each of said pairs of terminals; diode means connected in said series branch, the conductivity of the diode means controlling the transmission factor of the signal through the network; a source of direct current bias; electronic control means connecting said source with said network branch for controlling the bias potential applied across said diode means; a source of alternating current delivering oscillations; a rectifying device connected to said source of oscillations for deriving a control voltage by rectification thereof, said rectifying device having an electrode for controlling the amplitude of the control voltage derived; coupling means connecting said control voltage to said control means for controlling its conduction of bias potential from the direct-current source to the diode means; and rectifier means connected to the output of the amplifier and delivering a potential proportional to output amplitude, and connected to said electrode for applying said potential thereto to control the amplitude of the control voltage delivered to said control means in proportion to the amplitude of the signal at the amplifier output.

7. In a system as defined in claim 6, resistance means connected between the source of bias potential and the diode means and normally applying a bias driving the conductivity thereof in one direction; and said control means being connected between the source of potential and the diode means for reversing the polarity of the bias potential across the diode means when its conductivity is altered by the rectified output signal.

8. In a system as defined in claim 6, neutralizing impedance means connected to form a second series branch in parallel with the first-mentioned series branch of the network and neutralizing the internal capacitance of the diode means to reduce the transmission factor of the network substantially to zero when the diode means is blocked.

9. In a system as defined in claim 6, voltage divider resistance means connected across said bias source and coupled to said diode means for normally biasing it conductive; said control means comprising a first transistor having its collector-emitter circuit connected between one terminal of said bias source and the diode means and having its base electrode connected to said rectifying device to receive said control voltage; and said rectifying device comprising a second transistor having a collector-emitter rectifying path, the base electrode of the second transistor being connected to said rectifier means and controlling the amplitude of the control voltage to bias said control means more conductive as the output signal increases and thereby rendering the diode means increasingly less conductive.

References Cited in the file of this patent

UNITED STATES PATENTS

| | | |
|---|---|---|
| 2,279,128 | Paslay | Apr. 7, 1942 |
| 2,285,794 | Barney | June 9, 1942 |
| 2,859,286 | Kennedy | Nov. 4, 1958 |
| 2,870,271 | Cronburg | Jan. 20, 1959 |
| 2,895,045 | Kagan | July 14, 1959 |